(12) United States Patent
Kitajo et al.

(10) Patent No.: US 10,306,759 B2
(45) Date of Patent: May 28, 2019

(54) WIRING SUBSTRATE

(71) Applicant: SHINKO ELECTRIC INDUSTRIES CO., LTD., Nagano-shi, Nagano-ken (JP)

(72) Inventors: Natsuko Kitajo, Nagano (JP); Yuji Yukiiri, Nagano (JP); Izumi Tanaka, Nagano (JP)

(73) Assignee: SHINKO ELECTRIC INDUSTRIES CO., LTD. (JP)

( * ) Notice: Subject to any disclaimer, the term of this patent is extended or adjusted under 35 U.S.C. 154(b) by 0 days.

(21) Appl. No.: 15/845,257

(22) Filed: Dec. 18, 2017

(65) Prior Publication Data
US 2018/0184521 A1 Jun. 28, 2018

(30) Foreign Application Priority Data

Dec. 27, 2016 (JP) ................. 2016-254255

(51) Int. Cl.
| | |
|---|---|
| H01L 23/12 | (2006.01) |
| H05K 1/11 | (2006.01) |
| H05K 3/40 | (2006.01) |
| H05K 3/46 | (2006.01) |
| H01L 23/498 | (2006.01) |
| H05K 3/00 | (2006.01) |
| H05K 3/42 | (2006.01) |

(52) U.S. Cl.
CPC ............ *H05K 1/111* (2013.01); *H01L 23/12* (2013.01); *H01L 23/49822* (2013.01); *H01L 23/49827* (2013.01); *H05K 1/115* (2013.01); *H05K 3/0035* (2013.01); *H05K 3/40* (2013.01); *H05K 3/429* (2013.01); *H05K 3/46* (2013.01); *H05K 3/4602* (2013.01); *H01L 23/49811* (2013.01); *H05K 2201/096* (2013.01); *H05K 2201/09827* (2013.01); *H05K 2203/107* (2013.01); *H05K 2203/1194* (2013.01)

(58) Field of Classification Search
USPC .................................................. 361/767, 808
See application file for complete search history.

(56) References Cited

U.S. PATENT DOCUMENTS

2010/0208437 A1* 8/2010 Maeda ................ H01L 21/4857
361/760

FOREIGN PATENT DOCUMENTS

| JP | 2009188145 A | 8/2009 |
|---|---|---|
| JP | 2016035969 A | 3/2016 |

* cited by examiner

*Primary Examiner* — Andargie M Aychillhum
(74) *Attorney, Agent, or Firm* — Tarolli, Sundheim, Covell & Tummino LLP

(57) ABSTRACT

A wiring substrate includes a pad, an insulation layer that covers the pad, and a via wiring extending through the insulation layer and connected to the pad. The via wiring includes a first via portion, which has a diameter that is decreased from an upper surface of the insulation layer toward the pad, and a second via portion, which has a diameter that is increased from a lower end of the first via portion toward the pad. The diameter of the second via portion at an upper surface of the pad is larger than the diameter of the first via portion at the upper surface of the insulation layer.

16 Claims, 6 Drawing Sheets

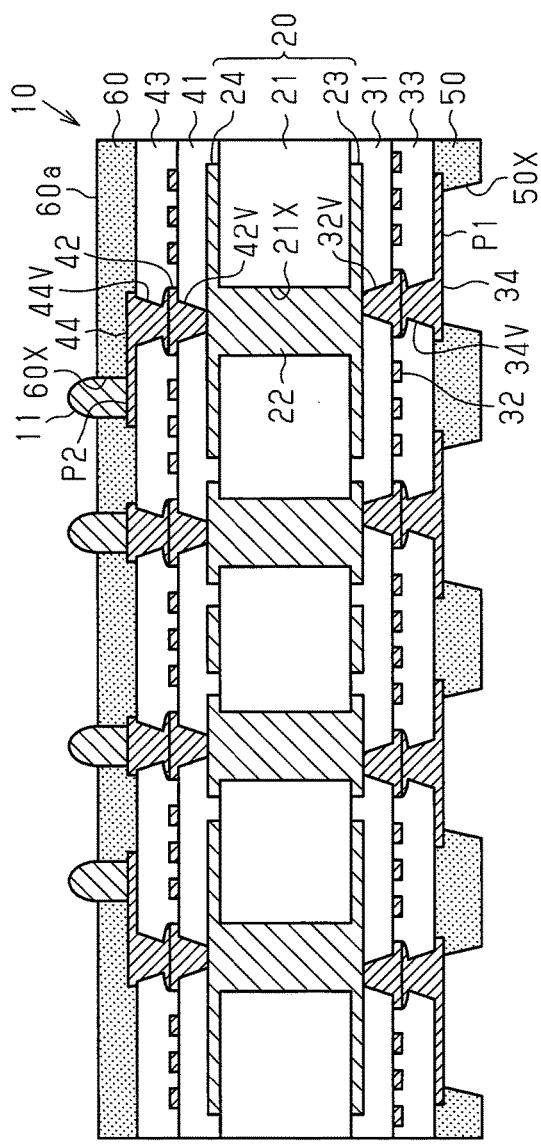
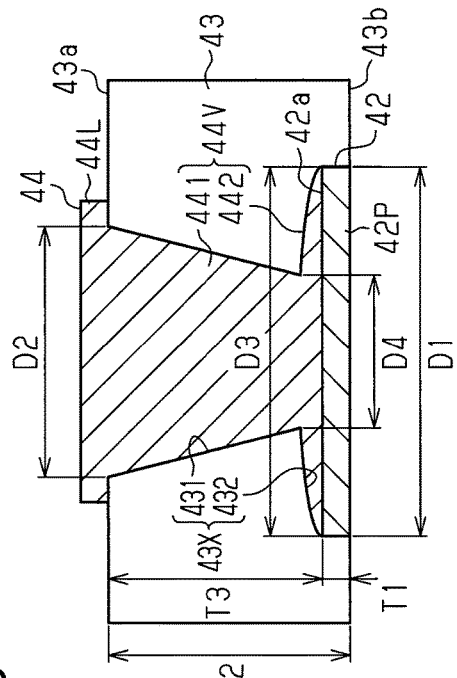
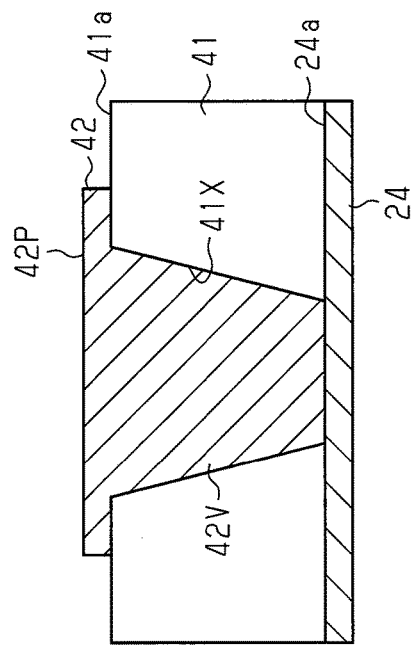
Fig.1A
Fig.1B
Fig.1C

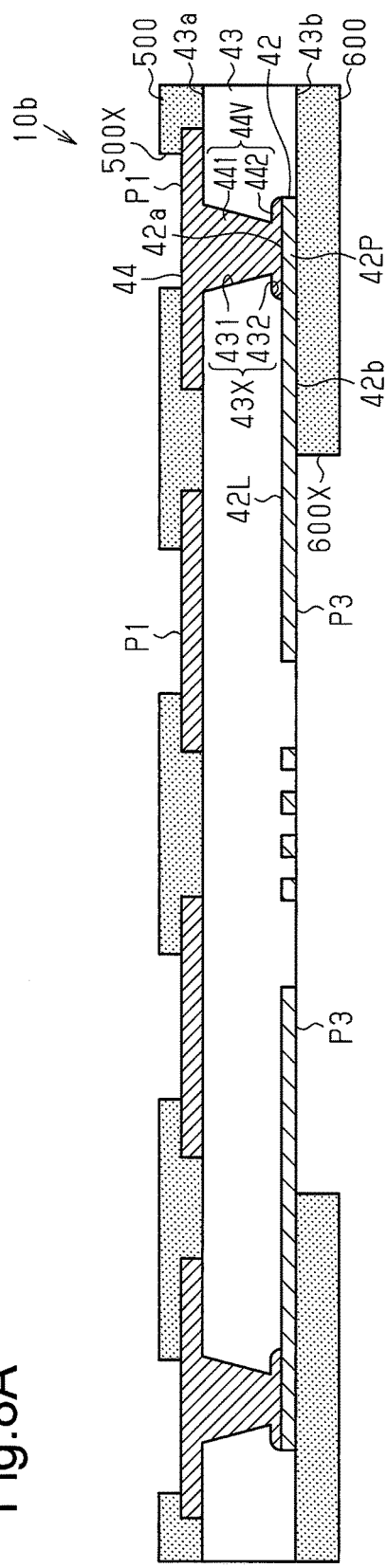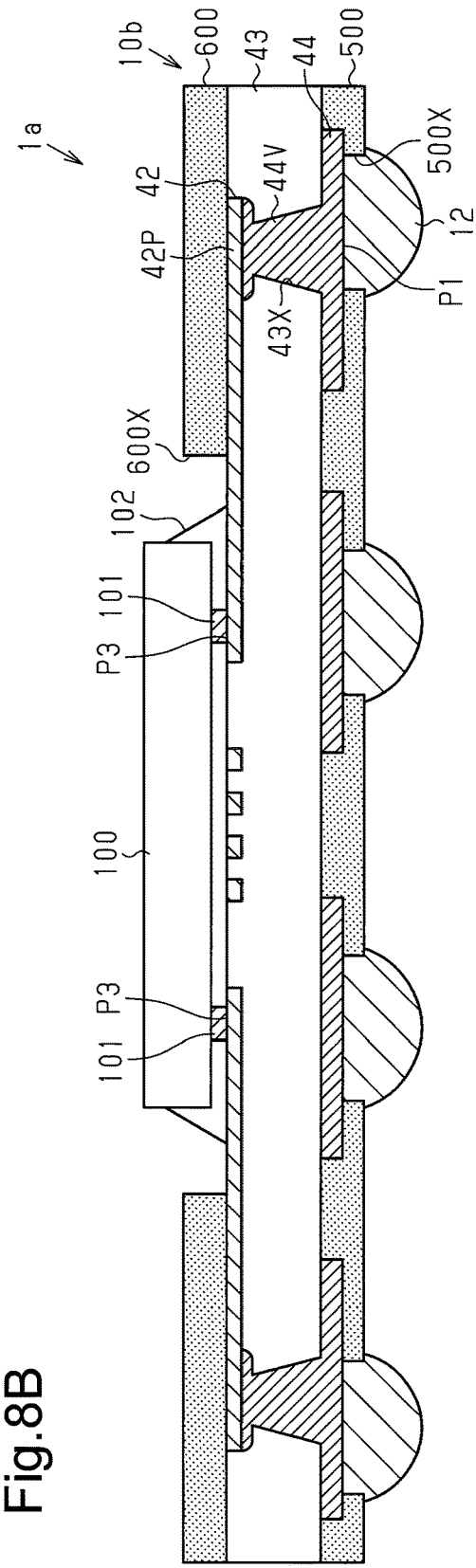

WIRING SUBSTRATE

CROSS-REFERENCE TO RELATED APPLICATIONS

This application is based upon and claims the benefit of priority from prior Japanese Patent Application No. 2016-254255, filed on Dec. 27, 2016, the entire contents of which are incorporated herein by reference.

FIELD

This disclosure relates to a wiring substrate and a method for manufacturing a wiring substrate.

BACKGROUND

To increase the density of wiring patterns of a wiring substrate on which an electronic component such as a semiconductor chip is mounted, a known wiring substrate is formed by alternately stacking wiring layers and insulation layers through a build-up process. The wiring layers are connected to each other by via wirings that are formed in through holes (via holes) extending through the insulation layer. The through holes are formed, for example, by irradiating the insulation layers with laser beams. Japanese Laid-Open Patent Publication No. 2016-035969 discloses such a conventional wiring substrate.

SUMMARY

A wiring substrate on which an electronic component is mounted may include an insulation layer containing filler that has a large particle size such as silica. Filler decreases the thermal expansion coefficient of the insulation layer. Decreases in the difference between the thermal expansion coefficient of the insulation layer and the thermal expansion coefficient of the electronic component limit warpage of a semiconductor package that includes the wiring substrate and the electronic component.

The irradiation intensity of a laser beam is generally lower at a peripheral portion than at a center portion. The difference in the irradiation intensity generates the disparity in the processability of a resin layer. Thus, when a through hole is formed by a laser beam, the diameter of a bottom (bottom diameter) of the through hole tends to be smaller than the diameter of a top (top diameter) of the through hole at the upper surface of the insulation layer. The filler contained in the insulation layer adversely affects the processability of the resin layer using the laser beam. Thus, when the amount of the filler contained in the resin layer is increased, the processability of the insulation layer is further adversely affected toward a peripheral portion of the laser beam and the bottom diameter of the through hole tends to become further smaller. This reduces the connection area between the via wiring filling the through hole and the wiring layer connected to the via wiring. Ultimately, the connection reliability may be decreased between wiring layers.

One embodiment is a wiring substrate that includes a pad, an insulation layer that covers the pad, and a via wiring extending through the insulation layer and connected to the pad. The via wiring includes a first via portion, which has a diameter that is decreased from an upper surface of the insulation layer toward the pad, and a second via portion, which has a diameter that is increased from a lower end of the first via portion toward the pad. The diameter of the second via portion at an upper surface of the pad is larger than the diameter of the first via portion at the upper surface of the insulation layer.

Another embodiment is a method for manufacturing a wiring substrate. The method includes forming an insulation layer that covers a pad, forming an opening that partially exposes an upper surface of the pad by irradiating the insulation layer with a laser beam, forming a through hole in the insulation layer by removing the transformed portion from the insulation layer, and forming a via wiring by filling the through hole with a conductive body. The forming an opening includes forming a transformed portion by heating the pad with the laser beam to transform a portion of the insulation layer that is in contact with the pad around the opening. The through hole includes a first hole portion and a second hole portion. The first hole portion is defined by a portion of the opening and has a diameter that is decreased from an upper surface of the insulation layer toward the pad. The second hole portion has a diameter that is increased from a lower end of the first hole portion toward the pad. The via wiring includes a first via portion and a second via portion. The first via portion has a diameter that is decreased from the upper surface of the insulation layer toward the pad. The second via portion has a diameter that is increased from a lower end of the first via portion toward the pad.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 1A is a schematically cross-sectional view of a wiring substrate;

FIG. 1B is an enlarged cross-sectional view illustrating a via wiring of the wiring substrate illustrated in FIG. 1A;

FIG. 1C is an enlarged cross-sectional view illustrating another via wiring of the wiring substrate illustrated in FIG. 1A;

FIG. 8A is a schematically cross-sectional view illustrating another modified example of a wiring substrate; and FIG. 8B is a schematically cross-sectional view of a semiconductor device including the wiring substrate of FIG. 8A.

DESCRIPTION OF THE EMBODIMENTS

Figure 2:
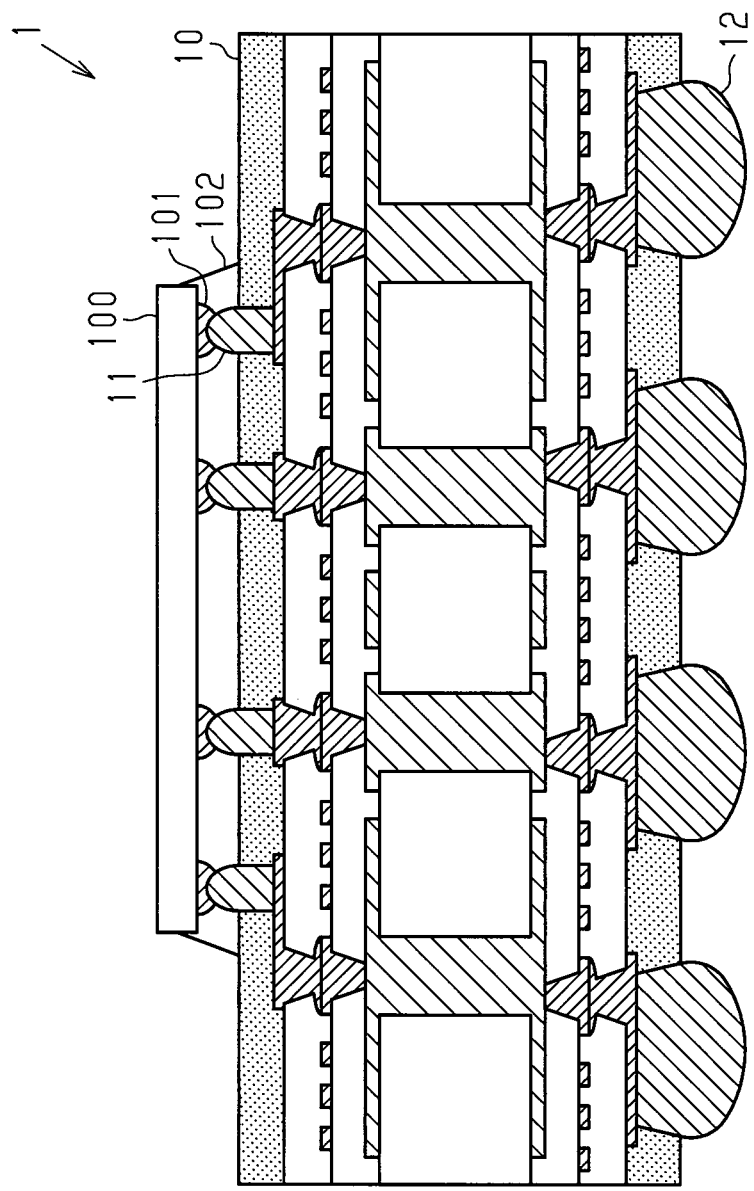
FIG. 2 is a schematically cross-sectional view of a semiconductor device including the wiring substrate of FIG. 1A.

Embodiments will now be described with reference to the accompanying drawings. Elements in the drawings may be partially enlarged for simplicity and clarity and thus have not necessarily been drawn to scale. To facilitate understanding, hatching lines may not be illustrated or be replaced by shadings in the cross-sectional drawings. In the description hereafter, the "plan view" refers to the view of an object taken in a vertical direction (for example, upper-lower direction in FIG. 1A), and the "planar shape" refers to the shape of an object taken in the vertical direction.

As illustrated in FIG. 2, a semiconductor device 1 includes a wiring substrate 10 and a semiconductor element 100. Bumps 11 are formed on an upper surface of the wiring substrate 10 to mount the semiconductor element 100. The semiconductor element 100 is connected to the bumps 11 by solder members 101. The solder members 101 are, for example, solder bumps formed on the semiconductor element 100. The gap between the wiring substrate 10 and the semiconductor element 100 is filled with an underfill resin 102.

Solder bumps 12 are formed on a lower surface of the wiring substrate 10. The solder bumps 12 function as external connection terminals used to mount the semiconductor device 1 (wiring substrate 10) on another board, for example, a mount board such as a motherboard. The external connection terminals may be solder balls, lead pins, stud bumps, or the like.

The semiconductor element 100 may be, for example, a logic chip such as a central processing unit (CPU) chip or a graphics processing unit (GPU) chip. Alternatively, the semiconductor element 100 may be, for example, a memory chip such as a dynamic random access memory (DRAM) chip, a static random access memory (SRAM) chip, or a flash memory chip. Further, a plurality of semiconductor elements 100 having the combination of, for example, a logic chip and a memory chip may be mounted on the wiring substrate 10.

The wiring substrate 10 will now be described.

As illustrated in FIG. 1A, the wiring substrate 10 includes a substrate body 20 located proximate to the center of the wiring substrate 10 in the thickness-wise direction.

The substrate body 20 includes a core substrate 21 and through electrodes 22. The through electrodes 22 are formed in through holes 21X extending through the core substrate 21 in the thickness-wise direction. Additionally, the substrate body 20 includes a wiring layer 23, which is formed on a lower surface of the core substrate 21, and a wiring layer 24, which is formed on an upper surface of the core substrate 21. The wiring layers 23, 24 are electrically connected to each other by the through electrodes 22.

The material of the core substrate 21 may be, for example, a so-called glass-epoxy resin obtained by impregnating a glass cloth (glass woven cloth), as a reinforcement material, with a thermosetting insulative resin, the main component of which is an epoxy resin, and curing the thermosetting insulative resin. The reinforcement material is not limited to a glass cloth. For example, a glass non-woven cloth, an aramid woven cloth, an aramid non-woven cloth, a liquid crystal polymer (LCP) woven cloth, or an LCP non-woven cloth may be used as the reinforcement material. The thermosetting insulative resin is not limited to an epoxy resin. For example, a resin material such as a polyimide resin or a cyanate resin may be used as the thermosetting insulative resin. The material of the through electrodes 22 and the wiring layers 23, 24 may be, for example, copper (Cu) or a copper alloy.

A plurality of (two in FIG. 1A) insulation layers 31, 33 and a plurality of (two in FIG. 1A) wiring layers 32, 34 are stacked at a lower surface side of the substrate body 20. In the present example, the insulation layer 31 is formed on the lower surface of the core substrate 21 to cover the wiring layer 23. The wiring layer 32 is formed on a lower surface of the insulation layer 31. The wiring layer 32 includes via wirings 32V, which extend through the insulation layer 31 in the thickness-wise direction, and wiring patterns, which are electrically connected to the wiring layer 23 by the via wirings 32V and formed on the lower surface of the insulation layer 31.

The insulation layer 33 is formed on the lower surface of the insulation layer 31 to cover the wiring layer 32. The wiring layer 34 is formed on a lower surface of the insulation layer 33. The wiring layer 34 includes via wirings 34V, which extend through the insulation layer 33 in the thickness-wise direction, and wiring patterns, which are electrically connected to the wiring layer 32 by the via wirings 34V and formed on the lower surface of the insulation layer 33. The material of the insulation layers 31, 33 may be, for example, an insulative resin such as an epoxy resin or a polyimide resin. Alternatively, a resin material in which the insulative resin is mixed with filler such as silica or alumina may be used. The material of the wiring layers 32, 34 may be, for example, copper (Cu) or a copper alloy.

A plurality of (two in FIG. 1A) insulation layers 41, 43 and a plurality of (two in FIG. 1A) wiring layers 42, 44 are stacked at an upper surface side of the substrate body 20. In the present example, the insulation layer 41 is formed on the upper surface of the core substrate 21 to cover the wiring layer 24. The wiring layer 42 is formed on an upper surface of the insulation layer 41. The wiring layer 42 includes via wirings 42V, which extend through the insulation layer 41 in the thickness-wise direction, and wiring patterns, which are electrically connected to the wiring layer 24 by the via wirings 42V and formed on the upper surface of the insulation layer 41.

The insulation layer 43 is formed on the upper surface of the insulation layer 41 to cover the wiring layer 42. The wiring layer 44 is formed on an upper surface of the insulation layer 43. The wiring layer 44 includes via wirings 44V, which extend through the insulation layer 43 in the thickness-wise direction, and wiring patterns (including a wiring pattern 44L illustrated in FIG. 1C), which are electrically connected to the wiring layer 42 by the via wirings 44V and formed on the upper surface of the insulation layer 43. The material of the insulation layers 41, 43 may be, for example, an insulative resin such as an epoxy resin or a polyimide resin. Alternatively, a resin material in which the insulative resin is mixed with filler such as silica or alumina may be used. The material of the wiring layers 42, 44 may be, for example, copper (Cu) or a copper alloy.

A protective insulation layer 50 is formed on a lower surface of the insulation layer 33 to cover the wiring layer 34. The protective insulation layer 50 includes openings 50X, which partially expose a lower surface of the wiring layer 34 as external connection pads P1. The protective insulation layer 50 may be, for example, a photosensitive dry film resist or a liquid photoresist. The material of such resist may be, for example, a novolac resin or an acrylic resin. For example, when a photosensitive dry film resist is used, the lower surface of the insulation layer 33 and the wiring layer 34 are laminated with a dry film through thermocompression bonding, and the dry film is patterned through a photolithography. This forms the protective insulation layer 50 including the openings 50X. When a liquid photoresist is used, the protective insulation layer 50 is also formed through the same process.

Additionally, a surface-processed layer may be formed on the lower surface of the wiring layer 34 exposed in the openings 50X. The surface-processed layer is, for example, a gold (Au) layer, a nickel (Ni)/Au layer (a metal layer in which Au is formed on Ni layer serving as bottom layer), or an Ni/palladium (Pd)/Au layer (metal layer in which Ni layer serves as bottom layer and Ni layer, Pd layer, and Au layer are stacked in this order). The Au layer is a metal layer formed from Au or an Au alloy. The Ni layer is a metal layer formed from Ni or an Ni alloy. The Pd layer is a metal layer formed from Pd or a Pd alloy. Alternatively, a surface-processed layer may be formed by performing an anti-oxidation process such as an organic solderability preservative (OSP) process on the lower surface of the wiring layer 34. For example, when the OSP process is performed, an organic coating of, for example, an azole compound or an imidazole compound is formed as the surface-processed layer. When a surface-processed layer is formed on the lower surface of the wiring layer 34, the surface-processed layer functions as the external connection pads P1.

A protective insulation layer 60 is formed on the upper surface of the insulation layer 43 to cover the wiring layer 44. The protective insulation layer 60 includes openings 60X, which partially expose an upper surface of the wiring layer 44 as external connection pads P2. Each opening 60X is, for example, circular in a plan view. The protective insulation layer 60 may be, for example, a photosensitive dry film resist or a liquid photoresist. The material of such resist may be, for example, a novolac resin or an acrylic resin. For example, when a photosensitive dry film resist is used, the upper surface of the insulation layer 43 and the wiring layer 44 are laminated with a dry film through thermocompression bonding, and the dry film is patterned through a photolithography. This forms the protective insulation layer 60 including the openings 60X. When a liquid photoresist is used, the protective insulation layer 60 is also formed through the same process.

The wiring layer 44 is the uppermost wiring layer. The bumps 11 are formed on the wiring layer 44 as connection terminals. The bumps 11 are connected to the wiring layer 44 in the openings 60X of the protective insulation layer 60. The bumps 11 project upward from an upper surface 60a of the protective insulation layer 60.

Additionally, a surface-processed layer may be formed on the upper surface of the wiring layer 44 exposed in the openings 60X. In the same manner as the surface-processed layer of the wiring layer 34, the surface-processed layer of the wiring layer 44 is, for example, an Au layer, an Ni/Au layer, or an Ni/Pd/Au layer. The Au layer is formed from Au or an Au alloy. The Ni layer is formed from Ni or an Ni alloy. The Pd layer is formed from Pd or a Pd alloy. Alternatively, a surface-processed layer may be formed by performing an anti-oxidation process such as the OSP process on the upper surface of the wiring layer 44. When a surface-processed layer is formed on the upper surface of the wiring layer 44, the surface-processed layer functions as the external connection pads P2.

The via wirings 42V, 44V will now be described.

FIG. 1B illustrates one of the via wirings 42V of the wiring layer 42. The insulation layer 41 includes through holes 41X (only one illustrated in FIG. 1B), which extend through the insulation layer 41 in the thickness-wise direction to partially expose the upper surface of the wiring layer 24. The via wirings 42V are formed in the through holes 41X of the insulation layer 41. The wiring patterns of the wiring layer 42 are located on an upper surface 41a of the insulation layer 41 and connected to the wiring layer 24 by the via wirings 42V. As illustrated in FIG. 1B, the wiring layer 24 is formed as, for example, a plane (planar) wiring portion.

The through holes 41X are circular in a plan view. The diameter of each through hole 41X is decreased from the upper surface 41a of the insulation layer 41 toward an upper surface 24a of the wiring layer 24. For example, the through hole 41X is tapered or shaped as an inverted truncated cone so that the diameter is gradually decreased from the upper surface 41a of the insulation layer 41 to the upper surface 24a of the wiring layer 24. The through holes 41X are filled with the via wirings 42V. Therefore, the diameter of each via wiring 42V is decreased from the upper surface 41a of the insulation layer 41 toward the upper surface 24a of the wiring layer 24. For example, the via wiring 42V is tapered or shaped as an inverted truncated cone so that the diameter is gradually decreased from the upper surface 41a of the insulation layer 41 to the upper surface 24a of the wiring layer 24.

The wiring layer 23, which is illustrated in FIG. 1A, is plane in the same manner as the wiring layer 24, which is illustrated in FIG. 1B. Each via wiring 32V of the wiring layer 32, which extends through the insulation layer 31 and is connected to the wiring layer 23, has a diameter decreased from the lower surface of the insulation layer 31 toward the lower surface of the wiring layer 23. The via wiring 32V is, for example, tapered or shaped as a truncated cone so that the diameter is gradually decreased from the lower surface of the insulation layer 31 to the lower surface of the wiring layer 23. In the present example, the via wirings 32V have a structure that is inverted upside down from the via wirings 42V but otherwise have the same structure as the via wirings 42V.

FIG. 1C illustrates one of the via wirings 44V of the wiring layer 44. The insulation layer 43 includes through holes 43X (only one illustrated in FIG. 1C), which extend through the insulation layer 43 in the thickness-wise direction and partially expose the upper surface of the wiring layer 42. The via wirings 44V are formed in the through holes 43X of the insulation layer 43. The wiring pattern 44L of the wiring layer 44 is located on an upper surface 43a of the insulation layer 43 and connected to the wiring layer 42 by the via wiring 44V.

The wiring layer 42 includes pads 42P (only one illustrated in FIG. 1C). The pads 42P are connected to other connection pads (not illustrated) by wiring patterns (not illustrated) of the wiring layer 42. The planar shape of each pad 42P is, for example, circular. The size (diameter D1) of the pad 42P may be set to, for example, 80 to 125 μm. The thickness T1 of the pad 42P may be set to, for example, 11 to 19 μm.

Each of the through holes 43X is circular in a plan view. Each through hole 43X includes a first hole portion 431, which extends into the insulation layer 43 from the upper surface 43a of the insulation layer 43, and a second hole portion 432, which extends through the insulation layer 43 from the lower end of the first hole portion 431 to the wiring layer 42 (upper surface 42a of pad 42P in the present example).

The first hole portion 431 includes an upper end having an open diameter D2 and a lower end having an open diameter D4. The first hole portion 431 is formed so that the open diameter D4 of the lower end is smaller than the open diameter D2 of the upper end, which is located at the upper surface 43a of the insulation layer 43. In the present example, the diameter of the first hole portion 431 is gradually decreased from the upper surface 43a of the insulation layer 43, defining the upper end, toward the lower side (wiring layer 42). The first hole portion 431 is, for example, tapered or shaped as an inverted truncated cone so that the diameter is decreased from the upper surface 43a of the insulation layer 43 toward the wiring layer 42.

The second hole portion 432 includes an upper end having the open diameter D4 and a lower end having an open diameter D3. The upper end of the second hole portion 432 corresponds to the lower end of the first hole portion 431. Thus, the upper end of the second hole portion 432 has the open diameter D4, which is the same as that of the lower end of the first hole portion 431. The second hole portion 432 is formed so that the open diameter D3 of the lower end, which is located at the upper surface 42a of the wiring layer 42, is larger than the open diameter D4 of the upper end (i.e., open diameter D4 of lower end of first hole portion 431). In the present example, the diameter of the second hole portion 432 is gradually increased from the lower end of the first hole portion 431 toward the lower side (wiring layer 42). The second hole portion 432 is defined by a wall that is roundly recessed toward the wiring layer 44 in a cross-sectional view. Thus, the wall of the second hole portion 432 has a curved surface. In the present embodiment, the open diameter D3 of the lower end of the second hole portion 432 is set to be equal to the diameter D1 of each pad 42P.

The thickness T2 of the insulation layer 43 may be set to, for example, 37 to 53 μm. As described above, the thickness T1 of each pad 42P may be set to, for example, 11 to 19 μm. Therefore, the depth T3 of each through hole 43X may be set to, for example, 26 to 34 μm. The open diameter D2 of the upper end of the first hole portion 431, which is located at the upper surface 43a of the insulation layer 43, may be set to, for example, 61 to 69 μm. The open diameter D4 of the lower end of the first hole portion 431, that is, the open diameter D4 of the upper end of the second hole portion 432, may be set to, for example, 46 to 54 μm. The open diameter D3 of the lower end of the second hole portion 432 is equal to the diameter D1 of each pad 42P and may be set to, for example, 80 to 125 μm. Thus, the open diameter D4 of the lower end of the first hole portion 431 (open diameter D4 of upper end of second hole portion 432) is the minimum diameter of each through hole 43X.

The through holes 43X are filled with the via wirings 44V. Thus, each via wiring 44V includes a first via portion 441, which fills the first hole portion 431, and a second via portion 442, which fills the second hole portion 432.

The first via portion 441 is formed in conformance with the shape of the first hole portion 431. Thus, the diameter of the first via portion 441 is decreased from the upper surface 43a toward a lower surface 43b of the insulation layer 43. The diameter of the first via portion 441 is, for example, tapered or shaped as an inverted truncated cone so that the diameter is gradually decreased from the upper surface 43a of the insulation layer 43 toward the lower surface 43b. The diameter of the upper end of the first via portion 441 (i.e., top of via wiring 44V) may be set to, for example, 61 to 69 μm. The diameter of the lower end of the first via portion 441 may be set to, for example, 46 to 54 μm.

The second via portion 442 is formed in conformance with the shape of the second hole portion 432. Thus, the diameter of the second via portion 442 is increased from the lower end of the first via portion 441 (i.e., upper end of second via portion 442) toward the upper surface 42a of the pad 42P. The second via portion 442 includes a peripheral surface that is roundly bulged toward the upper surface 43a of the insulation layer 43. Thus, the peripheral surface of the second via portion 442 has a curved surface.

The wiring layer 32, which is illustrated in FIG. 1A, includes pads formed in the same manner as the pads 42P of the wiring layer 42. The via wirings 34V of the wiring layer 34 connect the pads of the wiring layer 32 to the wiring patterns of the wiring layer 34, which are formed on the lower surface of the insulation layer 33. The insulation layer 33 includes through holes that are formed in the same manner as the through holes 43X, one of which is illustrated in FIG. 1C. Thus, each of the through holes of the insulation layer 33 includes a first hole portion, the diameter of which is decreased from the lower surface of the insulation layer 33 toward the pad of the wiring layer 32, and a second hole portion, the diameter of which is increased from an upper end of the first hole portion toward the pad of the wiring layer 32. In the present example, the through holes of the insulation layer 33 have a structure that is inverted upside down from the through holes 43X (first and second hole portions 431, 432), one of which is illustrated in FIG. 1C, but otherwise have the same structure as the through holes 43X.

Accordingly, each via wiring 34V of the wiring layer 34 includes a first via portion, the diameter of which is decreased from the lower surface of the insulation layer 33 toward the pad of the wiring layer 32, and a second via portion, the diameter of which is increased from an upper surface of the first via portion toward the pad of the wiring layer 32. In the present example, the via wirings 34V have a structure that is inverted upside down from the via wirings 44V (first and second via portions 441, 442), one of which is illustrated in FIG. 1C, but otherwise have the same structure as the via wirings 44V.

One example of a method for manufacturing the wiring substrate 10 will now be described. For the sake of brevity, portions that ultimately become elements of the wiring substrate 10 may be indicated by reference characters used to denote the final elements. Additionally, the reference characters of elements that are irrelevant to the description of the manufacturing process may be omitted.

Figure 3:
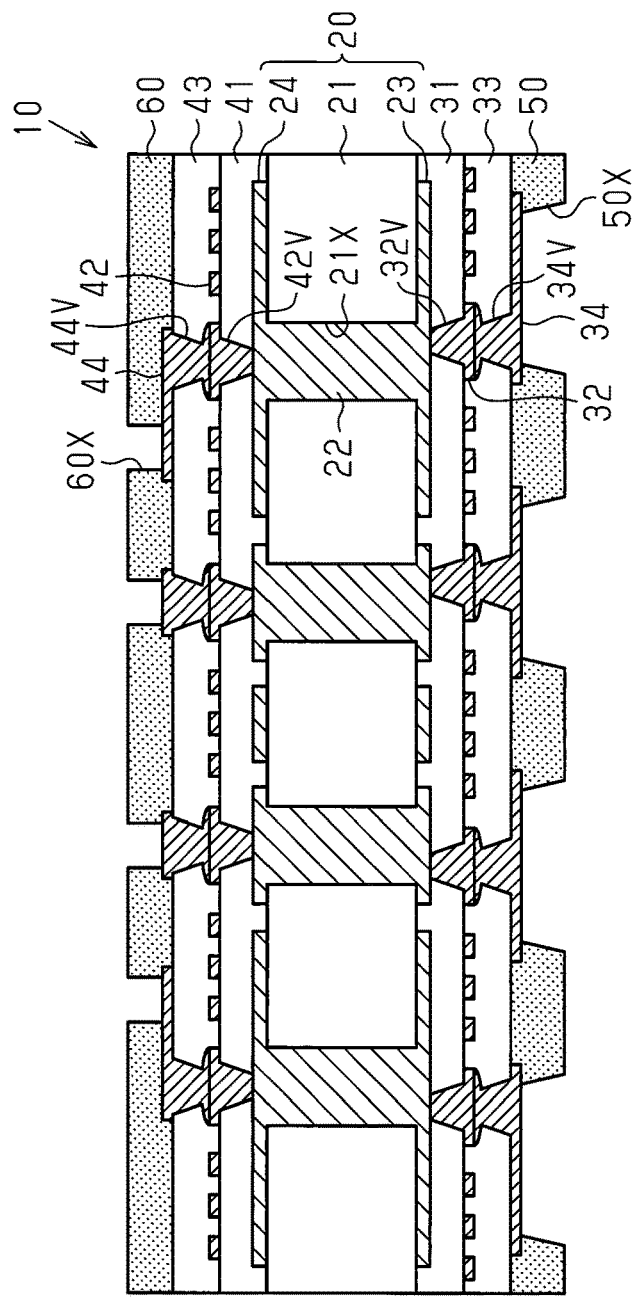
FIGS. 3 and 4A to 4D are schematically cross-sectional views illustrating a method for manufacturing the wiring substrate of FIG. 1A.

The wiring substrate 10, which is illustrated in FIG. 3, may be manufactured through a known manufacturing process. One example of such a manufacturing process will now be briefly described.

The through holes 21X are formed in desired locations of the core substrate 21. A plating or a conductive paste is applied to the inside of the through holes 21X to form the through electrodes 22. Then, the wiring layers 23, 24 are formed through, for example, a subtractive process. The wiring layers 23, 24 are connected to each other by the through electrodes 22. The upper surface and the lower surface of the core substrate 21 are vacuum-laminated with resin films. The resin films are heated and cured to form the insulation layers 41, 31. Alternatively, a resin paste or a liquid resin may be applied and heated to form the insulation layers 41, 31. Subsequently, openings are formed in the insulation layers 41, 31. If necessary, a desmear process is performed. Then, the wiring layers 42, 32 are formed through, for example, a semi-additive process. The insulation layers 43, 33 and the wiring layers 44, 34 are formed in the same manner.

The protective insulation layer 60 including the openings 60X is formed on the upper surface of the insulation layer 43. The protective insulation layer 50 including the openings 50X is formed on the lower surface of the insulation layer 33. The protective insulation layer 60 is obtained, for example, by laminating the upper surface of the insulation layer 43 with a photosensitive solder resist film or applying a liquid solder resist to the upper surface of the insulation layer 43 and then performing exposure and development on the resist through a photolithography process to pattern the resist into a desired shape. In the same manner, the protective insulation layer 50 is obtained, for example, by laminating the lower surface of the insulation layer 33 with a photosensitive solder resist film or applying a liquid solder resist to the lower surface of the insulation layer 33 and then performing exposure and development on the resist to pattern the resist into a desired shape.

A method for forming the via wiring 44V, which is illustrated in FIG. 1C, will now be described. The following description refers to drawings that partially enlarge the wiring substrate 10 (refer to FIG. 1A) in the same manner as in FIG. 1C.

Figure 4A:
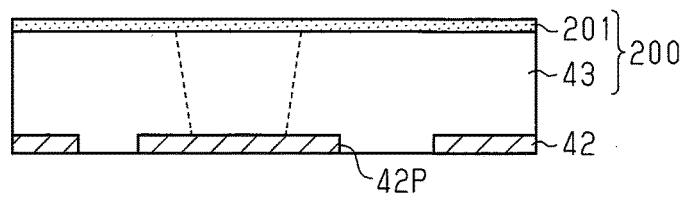

As illustrated in FIG. 4A, an insulation layer formation member 200 is applied to the upper surface of the insulation layer 41 (refer to FIG. 1A) to cover the wiring layer 42. The insulation layer formation member 200 includes a support film 201 and the semi-cured insulation layer 43, which is located on a lower surface of the support film 201. The semi-cured insulation layer 43 covers the upper surface and the side surfaces of the wiring layer 42 (pads 42P). The insulation layer formation member 200 is applied to the upper surface of the insulation layer 41, for example, through vacuum thermocompression bonding. Then, the insulation layer 43 is, for example, heated and cured. The broken lines illustrated in FIG. 4A indicate the position that is irradiated with a laser beam to form an opening 202X in the next step.

The support film 201 supports the insulation layer 43. The material of the support film 201 may be, for example, polyester such as polyethylene terephthalate (PET), polyethylene, polyolefin such as polyvinyl chloride, or polycarbonate. The thickness of the support film 201 may be set to, for example, 30 μm to 40 μm.

The semi-cured insulation layer 43 may be, for example, a semi-cured resin layer containing inorganic filler such as silica particles. The inorganic filler may be alumina particles or silica carbide particles. Further, different kinds of particles may be used. The material of the semi-cured resin layer is, for example, a thermosetting epoxy resin or a thermosetting polyolefin resin. The material of the semi-cured resin layer for the insulation layer 43 may be a resin other than those described above. The thickness of the semi-cured insulation layer 43 may be set to, for example, 37 to 53 μm.

Figure 4B:
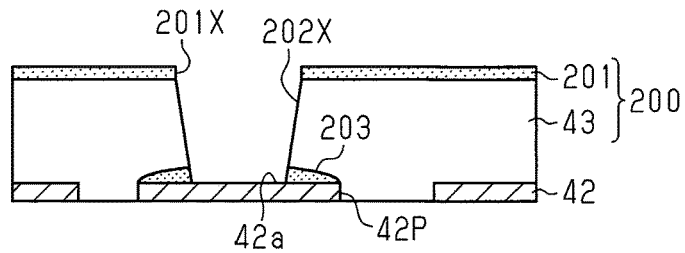

In the step of FIG. 4B, the cured insulation layer 43 is irradiated with a laser beam through the support film 201, which is illustrated in FIG. 4A, to form an opening 201X in the support film 201 and the opening 202X in the insulation layer 43. The opening 202X of the insulation layer 43 has a size that corresponds to the first hole portion 431, which is illustrated in FIG. 1C. The laser beam source used for the laser beam irradiation may be, for example, a carbon dioxide laser. Alternatively, the laser beam source may be, for example, a YAG laser, a UV-YAG laser, a YVO$_4$ laser, a YLF laser, or an excimer laser.

In this case, the intensity (energy) of the laser beam is set to a value sufficient to form the opening 202X having the desired diameter with one shot, or a single irradiation. For example, when the opening is formed in an insulation layer containing inorganic filler, irradiation is performed multiple times (e.g., three times or more) with a laser beam having energy needed to form the opening in an inorganic filler-free insulation layer. A laser beam having the total value of energy of the multiple-time laser beams as energy for a single irradiation is used.

Consequently, the pad 42P is heated by the energy of the emitted laser beam. The heat of the pad 42P transforms a portion of the insulation layer 43 that is in contact with the upper surface 42a of the pad 42P to form a transformed portion 203. The heat of the pad 42P is transmitted from the portion that is irradiated with the laser beam (center portion of pad 42P) to a peripheral portion. Thus, the transformed portion 203 is thicker toward the center portion of the pad 42P and thinner toward the peripheral portion of the pad 42P. One example of the process for transforming a portion of the insulation layer 43 is carbonizing and thermally decomposing the resin of the insulation layer 43. Another example of the process for transforming a portion of the insulation layer 43 is melting the resin of the insulation layer 43.

Figure 4C:
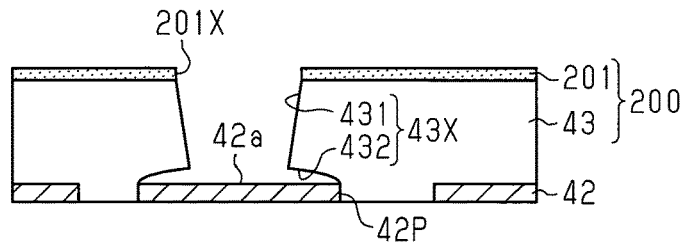

As illustrated in FIG. 4C, the transformed portion 203 (refer to FIG. 4B) is removed. This forms the second hole portion 432. As a result, the through hole 43X that includes the first hole portion 431 and the second hole portion 432 is formed in the insulation layer 43. For example, a desmear process may be performed to remove the transformed portion 203, which is illustrated in FIG. 4B. The desmear process may use, for example, a potassium permanganate solution. The transformed portion 203 may be easily removed from the insulation layer 43 through a removal process (e.g., desmear process). In this manner, the portion of the resin of the insulation layer 43 is transformed by irradiating with the laser beam so that the transformed portion 203 can be easily removed by the removal process such as the desmear process.

The transformed portion 203 is formed in the insulation layer 43 by heating the pad 42P with the irradiation of the laser beam. Thus, it is preferred that the diameter D1 of the pad 42P, which is illustrated in FIG. 1C, be set to be 1.2 to 2 times larger than the open diameter D2 of the first hole portion 431. The depth of the second hole portion 432 (distance from lower end of first hole portion 431 to upper surface 42a of pad 42P) is set to, for example, 1 to 3 μm in accordance with the transformation amount of the resin of the insulation layer 43 resulting from the heating of the pad 42P. That is, the thickness of the second via portion 442 (distance from upper surface 42a of pad 42P to upper end of second via portion 442 (or lower end of first via portion 441)) is set to 1 to 3 μm.

Accordingly, the depth of the first hole portion 431 (length of first hole portion 431 extending through insulation layer 43 from upper surface 43a of insulation layer 43 to lower end of first hole portion 431) is set to be 80% to 98% of the depth of the through hole 43X. It is preferred that the depth of the first hole portion 431 be set to 88% to 97% of the depth of the through hole 43X. Accordingly, the length of the first via portion 441 extending through the insulation layer 43 is set to 80% to 98% of the length of the via wiring 44V and preferably, 88% to 97% of the length of the via wiring 44V.

Figure 4D:
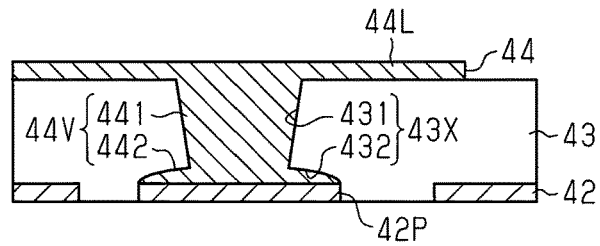

Referring again to FIG. 4C, after the transformed portion 203 is removed, the support film 201 is removed. Subsequently, as illustrated in FIG. 4D, the wiring layer 44 that includes the via wiring 44V and the wiring pattern 44L is formed.

The wiring layer 44 may be formed, for example, through a semi-additive process. For example, subsequent to the removal of the support film 201 illustrated in FIG. 4C, an electroless plating process (electroless copper plating process) is performed to form a seed layer covering the surface of the insulation layer 43. Then, a resist pattern is formed on the seed layer. The resist pattern is formed to expose portions of the seed layer where the via wiring 44V is formed and the wiring pattern 44L is formed.

Then, electrolytic plating (electrolytic copper plating) is performed using the seed layer as a power feeding layer to deposit a plating metal on the seed layer exposed from the resist pattern. This forms a conductive layer including the conductive body formed on the seed layer exposed from the resist pattern and the conductive body filling the through hole 43X. Then, the resist pattern is removed, and unnecessary portions of the seed layer exposed from the conductive layer are removed through etching. This forms the wiring layer 44 that includes the via wiring 44V and the wiring pattern 44L as illustrated in FIG. 4D.

Alternatively, the wiring layer 44 may be formed through a subtractive process. For example, subsequent to the removal of the support film 201 illustrated in FIG. 4C, an electroless plating process (electroless copper plating process) is preformed to form a seed layer covering the surface of the insulation layer 43. Electrolytic plating (electrolytic copper plating) is performed using the seed layer as a power feeding layer to deposit a plating metal on the seed layer. This forms a conductive layer including the conductive body formed on the seed layer and the conductive body filling the through hole 43X. Then, an etching mask is formed to cover the conductive layer. The etching mask is formed to cover portions where the via wiring 44V is formed and the wiring pattern 44L is formed. The portions of the conductive layer exposed from the etching mask are removed through etching. This forms the wiring layer 44 that includes the via wiring 44V and the wiring pattern 44L as illustrated in FIG. 4D.

The operation of the wiring substrate 10 will now be described.

As illustrated in FIGS. 1A and 1C, the wiring substrate 10 includes the wiring layer 42, the insulation layer 43 covering the wiring layer 42, and the wiring layer 44.

The wiring layer 42 includes the pads 42P. The insulation layer 43 includes the through holes 43X, which extend through the insulation layer 43 in the thickness-wise direction to partially expose the upper surface of the wiring layer 42. Each through hole 43X includes the first hole portion 431, which extends into the insulation layer 43 from the upper surface 43a of the insulation layer 43, and the second hole portion 432, which extends through the insulation layer 43 from the lower end of the first hole portion 431 to the wiring layer 42. The first hole portion 431 is tapered or shaped as an inverted truncated cone so that the diameter is decreased from the upper surface 43a of the insulation layer 43, defining the upper end of the first hole portion 431, toward the lower side (wiring layer 42). The second hole portion 432 includes the upper end having the open diameter D4, which is equal to that of the lower end of the first hole portion 431, and the lower end having the open diameter D3 at the upper surface 42a of the wiring layer 42. The second hole portion 432 is formed so that the open diameter D3 is larger than the open diameter D4.

The wiring layer 44 includes the via wirings 44V, which fill the through holes 43X. Each via wiring 44V includes the first via portion 441, which fills the first hole portion 431, and the second via portion 442, which fills the second hole portion 432. The first via portion 441 is tapered or shaped as an inverted truncated cone so that the diameter is decreased from the upper surface 43a of the insulation layer 43 toward the pad 42P of the wiring layer 42. The second via portion 442 is inversely tapered or shaped as a truncated cone so that the diameter is increased from the lower end of the first via portion 441 toward the pad 42P of the wiring layer 42. In other words, the second via portion 442 is formed so that the diameter of the upper end (top of second via portion 442) is smaller than the diameter of the lower end (bottom of second via portion 442) located at the upper surface 42a of the pad 42P of the wiring layer 42.

The via wiring 44V having the above structure has a larger connection area with the pad 42P than a simple via wiring that is tapered or shaped as an inverted truncated cone (e.g., via wiring 42V illustrated in FIG. 1B). This improves the connection reliability between the wiring layer 42 and the wiring layer 44.

The via wirings 42V, one of which is illustrated in FIG. 1B, are connected to the plane wiring layer 24. In FIG. 1A, one via wiring 42V is connected to one wiring layer 24 (plane wiring portion). However, a plurality of via wirings 42V are practically connected to one wiring layer 24 (plane wiring portion). Thus, the connection reliability of the wiring layer 24 and the wiring layer 42 is ensured by the plurality of via wirings 42V.

The present embodiment has the advantages described below.

(1) The wiring substrate 10 includes the wiring layer 42, the insulation layer 43 covering the wiring layer 42, and the wiring layer 44. The wiring layer 44 includes the via wirings 44V, which fill the through holes 43X and are connected to the pads 42P of the wiring layer 42. Each via wiring 44V includes the first via portion 441, which fills the first hole portion 431, and the second via portion 442, which fills the second hole portion 432. The first via portion 441 is tapered or shaped as an inverted truncated cone so that the diameter is decreased from the upper surface 43a of the insulation layer 43 toward the pad 42P of the wiring layer 42. The second via portion 442 is inversely tapered or shaped as a truncated cone so that the diameter is increased from the lower end of the first via portion 441 toward the pad 42P of the wiring layer 42. Thus, the diameter of the top of the second via portion 442 (substantially equal to open diameter D4) is smaller than the diameter of the bottom of the second via portion 442 (substantially equal to open diameter D3) located at the upper surface of the pad 42P.

The via wiring 44V having the above structure has a larger connection area with the pad 42P than a simple via wiring that is tapered or shaped as an inverted truncated cone (e.g., via wiring 42V illustrated in FIG. 1B). This improves the connection reliability between the wiring layer 42 and the wiring layer 44 as compared to when the wiring layer 42 and the wiring layer 44 are connected by the simple via wiring that is tapered or shaped as an inverted truncated cone.

(2) A resin material in which filler such as silica or alumina is mixed in an insulative resin such as an epoxy resin or a polyimide resin is used as the insulation layers 31, 33, 41, and 43. The filler decreases the thermal expansion coefficients of the insulation layers 31, 33, 41, and 43. This decreases the difference between the thermal expansion coefficients of the insulation layers 31, 33, 41, and 43 and the thermal expansion coefficient of the electronic component (in the present example, semiconductor element 100). Consequently, the warpage of a semiconductor package (semiconductor device 1) including the wiring substrate 10 and the electronic component is limited while forming finer wiring in the wiring substrate 10.

It should be apparent to those skilled in the art that the foregoing embodiments may be employed in many other specific forms without departing from the scope of this disclosure. Particularly, it should be understood that the foregoing embodiments may be employed in the following forms.

In the foregoing embodiment, the shape of the wiring substrate (number of wiring layers and number of insulation layers) may be modified.

Figure 5A:
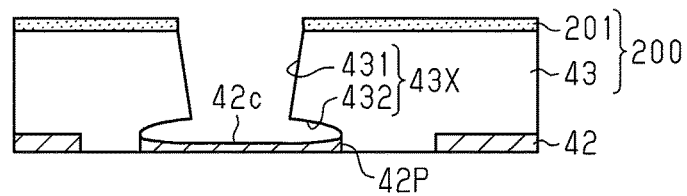
FIGS. 5A and 5B are schematically cross-sectional views illustrating a method for manufacturing a further wiring substrate.
Figure 5B:
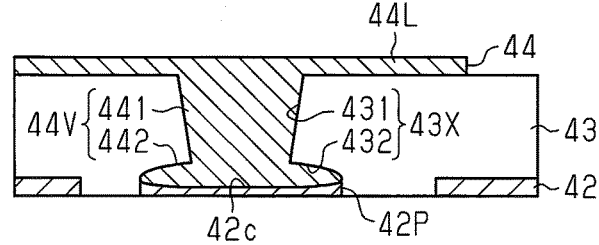

FIGS. 5A and 5B illustrate one example of a method for manufacturing a further wiring substrate.

The steps of FIGS. 5A and 5B are performed instead of the steps of FIGS. 4C and 4D of the embodiment. As described above, in the step of FIG. 4B, the irradiation with the laser beam transforms a portion of the insulation layer 43 to form the transformed portion 203. Then, in the step of FIG. 5A, the transformed portion 203 (refer to FIG. 4B) is removed. Further, an upper surface 42c of the pad 42P is recessed and curved so that the center portion is located at a lower position than the peripheral portion. The upper surface 42c may be formed by etching, for example, wet etching the pad 42P through the through hole 43X.

The support film 201 illustrated in FIG. 5A is removed. Subsequently, as illustrated in FIG. 5B, the wiring layer 44 that includes the via wiring 44V and the wiring pattern 44L is formed.

The wiring layer 44 may be formed, for example, through a semi-additive process. For example, after the removal of the support film 201 illustrated in FIG. 5A, an electroless plating process (electroless copper plating process) is performed to form a seed layer covering the surface of the insulation layer 43. Then, a resist pattern is formed on the seed layer. The resist pattern is formed to expose portions of the seed layer where the via wiring 44V is formed and the wiring pattern 44L is formed.

Electrolytic plating (electrolytic copper plating) is performed using the seed layer as a power feeding layer to deposit a plating metal on the seed layer exposed from the resist pattern. This forms a conductive layer including the conductive body formed on the seed layer, which is exposed from the resist pattern, and the conductive body filling the through hole 43X. Then, the resist pattern is removed, and unnecessary portions of the seed layer exposed from the conductive layer are removed. This forms the wiring layer 44 that includes the via wiring 44V and the wiring pattern 44L as illustrated in FIG. 5B.

Alternatively, the wiring layer 44 may be formed through a subtractive process. For example, subsequent to the removal of the support film 201 illustrated in FIG. 5A, an electroless plating process (electroless copper plating process) is performed to form a seed layer covering the surface of the insulation layer 43. Electrolytic plating (electrolytic copper plating) is performed using the seed layer as a power feeding layer to deposit a plating metal on the seed layer. This forms a conductive layer including the conductive body formed on the seed layer and the conductive body filling the through hole 43X. Then, an etching mask is formed to cover the conductive layer. The etching mask is formed to cover portions where the via wiring 44V is formed and the wiring pattern 44L is formed. The portions of the conductive layer exposed from the etching mask are removed through etching. This forms the wiring layer 44 that includes the via wiring 44V and the wiring pattern 44L as illustrated in FIG. 5B.

The via wiring 44V formed as described above has a further larger connection area with the upper surface 42c of the pad 42P than the above embodiment. Thus, the connection reliability between the via wiring 44V and the pad 42P is further improved.

Figure 6:
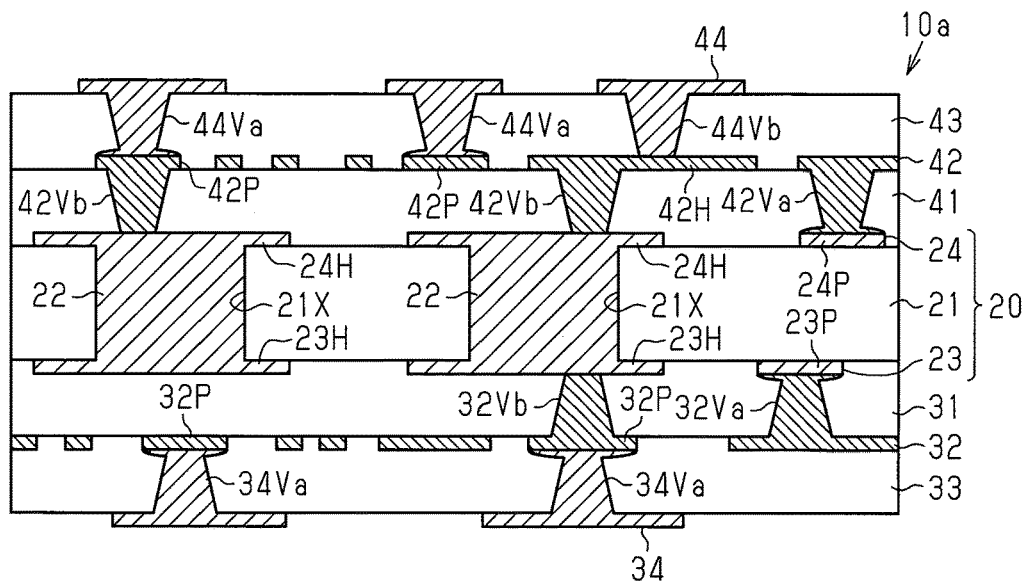
FIG. 6 is a schematically cross-sectional view illustrating a modified example of a wiring substrate.

FIG. 6 illustrates a modified example of a wiring substrate 10a. The wiring substrate 10a includes the substrate body 20 located proximate to the center of the wiring substrate 10a in the thickness-wise direction.

The substrate body 20 includes the core substrate 21 and the through electrodes 22, which are formed in the through holes 21X extending through the core substrate 21 in the thickness-wise direction. Additionally, the substrate body 20 includes the wiring layer 23, which is formed on the lower surface of the core substrate 21, and the wiring layer 24, which is formed on the upper surface of the core substrate 21. The wiring layers 23, 24 are electrically connected to each other by the through electrodes 22. The wiring layer 23 includes plane wiring portions 23H and pads 23P. In the same manner, the wiring layer 24 includes plane wiring portions 24H and pads 24P.

The material of the core substrate 21 may be, for example, a so-called glass-epoxy resin obtained by impregnating a glass cloth (glass woven cloth), as a reinforcement material, with a thermosetting insulative resin, the main component of which is an epoxy resin, and curing the resin. The reinforcement material is not limited to a glass cloth. For example, a glass non-woven cloth, an aramid woven cloth, an aramid non-woven cloth, an LCP woven cloth, or an LCP non-woven cloth may be used as the reinforcement material. The thermosetting insulative resin is not limited to an epoxy resin. For example, a resin material such as polyimide resin or a cyanate resin may be used as the thermosetting insulative resin. The material of the through electrodes 22 and the wiring layers 23, 24 may be, for example, copper (Cu) or a copper alloy.

A plurality of (two in FIG. 6) insulation layers 31, 33 and a plurality of (two in FIG. 6) wiring layers 32, 34 are stacked at a lower surface side of the substrate body 20. In the present example, the insulation layer 31 is formed on the lower surface of the core substrate 21 to cover the wiring layer 23. The wiring layer 32 is formed on the lower surface of the insulation layer 31. The wiring layer 32 includes via wirings 32Vb, which extend through the insulation layer 31 in the thickness-wise direction and are connected to the wiring portions 23H, and via wirings 32Va connected to the pads 23P. Further, the wiring layer 32 includes pads 32P and wiring patterns formed on the lower surface of the insulation layer 31. The via wirings 32Va are formed in the same manner as the via wirings 44V, one of which is illustrated in FIG. 1C. The via wirings 32Vb are formed in the same manner as the via wirings 42V, one of which is illustrated in FIG. 1B.

The insulation layer 33 is formed on the lower surface of the insulation layer 31 to cover the wiring layer 32. The wiring layer 34 is formed on the lower surface of the insulation layer 33. The wiring layer 34 includes via wirings 34Va, which extend through the insulation layer 33 in the thickness-wise direction and are connected to the pads 32P, and wiring patterns, which are electrically connected to the wiring layer 32 by the via wirings 34Va and formed on the lower surface of the insulation layer 33. The via wirings 34Va are formed in the same manner as the via wirings 44V, one of which is illustrated in FIG. 1C.

The material of the insulation layers 31, 33 may be, for example, a resin material in which filler such as silica or alumina is mixed in an insulative resin such as an epoxy resin or a polyimide resin. The material of the wiring layers 32, 34 may be, for example, copper (Cu) or a copper alloy.

A plurality of insulation layers 41, 43 (two layers in FIG. 6) and a plurality of wiring layers 42, 44 (two layers in FIG. 6) are stacked at the side of an upper surface of the substrate body 20. In the present example, the insulation layer 41 is formed on the upper surface of the core substrate 21 to cover the wiring layer 24. The wiring layer 42 is formed on the upper surface of the insulation layer 41. The wiring layer 42 includes via wirings 42Vb, which extend through the insulation layer 41 in the thickness-wise direction and are connected to the wiring portions 24H, and the via wirings 42Va connected to the pads 24P. The wiring layer 42 further includes the pads 42P, wiring portions 42H, and wiring patterns that are formed on the upper surface of the insulation layer 41. The wiring portions 42H are plane (planar). The via wirings 42Va are formed in the same manner as the via wirings 44V, one of which is illustrated in FIG. 1C. The via wirings 42Vb are formed in the same manner as the via wirings 42V, one of which is illustrated in FIG. 1B.

The insulation layer 43 is formed on the upper surface of the insulation layer 41 to cover the wiring layer 42. The wiring layer 44 is formed on the upper surface of the insulation layer 43. The wiring layer 44 includes the via wirings 44Va, which extend through the insulation layer 43 in the thickness-wise direction and are connected to the pads 42P, the via wirings 44Vb connected to the wiring portions 42H, and the wiring patterns formed on the upper surface of the insulation layer 43. The via wirings 44Va are formed in the same manner as the via wirings 44V, one of which is illustrated in FIG. 1C. The via wirings 44Vb are formed in the same manner as the via wirings 42V, one of which is illustrated in FIG. 1B.

The material of the insulation layers 41, 43 may be, for example, an insulative resin such as an epoxy resin or a polyimide resin. Alternatively, a resin material in which the insulative resin is mixed with filler such as silica or alumina may be used. The material of the wiring layers 42, 44 may be, for example, copper (Cu) or a copper alloy.

Although not illustrated in FIG. 6, a protective insulation layer is formed on the lower surface of the insulation layer 33 to cover the wiring layer 34. The protective insulation layer includes openings partially exposing the lower surface of the wiring layer 34 as external connection pads. A surface-processed layer may be formed on the exposed surface of the wiring layer 34. Additionally, a protective insulation layer is formed on the upper surface of the insulation layer 43 to cover the wiring layer 44. The protective insulation layer includes openings partially exposing the upper surface of the wiring layer 44 as external connection pads. A surface-processed layer may be formed on the exposed surface of the wiring layer 44. Bumps functioning as connection terminals may be formed on the wiring layer 44, which defines the uppermost wiring layer.

In the wiring substrate 10a, the pads and the plane wiring portions are included in the same wiring layer. For example, the wiring layer 42 includes the pads 42P and the wiring portions 42H. The insulation layer 43, which covers the wiring layer 42, includes through holes (first through holes), each of which includes the first hole portion and the second hole portion described above, at positions corresponding to the pads 42P. Additionally, the insulation layer 43 includes through holes (second through holes), each of which is tapered or shaped as an inverted truncated cone so that the diameter is gradually decreased from the upper surface of the insulation layer 43 to the wiring portion 42H, at positions corresponding to the wiring portions 42H. Each via wiring 44Va connected to the pad 42P includes the first via portion and the second via portion, which are described above. The via wirings 32Va, 34Va, and 42Va are formed in the same manner as the via wirings 44Va. Each via wiring 44Vb connected to the wiring portion 42H is tapered or shaped as an inverted truncated cone so that the diameter is gradually decreased from the upper surface of the insulation layer 43 to the upper surface of the wiring portion 42H. The via wirings 32Vb, 42Vb are also formed in the same manner as the via wirings 44Vb.

Figure 7A:
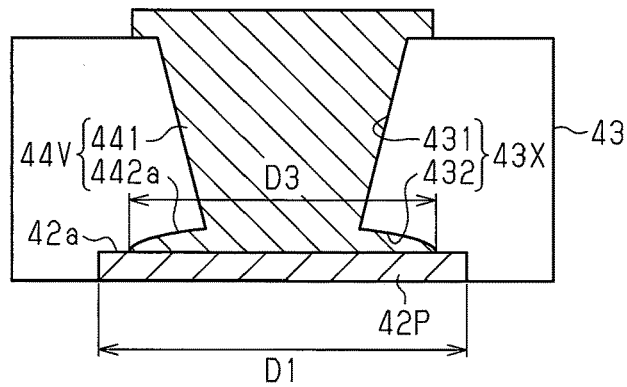
FIGS. 7A and 7B are schematically cross-sectional views illustrating modified examples of via wirings.
Figure 7B:
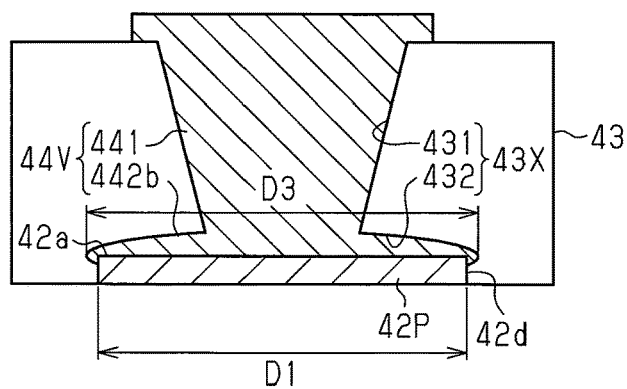

As illustrated in FIG. 7A, the via wiring 44V may include a second via portion 442a that has a smaller diameter than the pad 42P. As illustrated in FIG. 7B, the via wiring 44V may include a second via portion 442b that covers a portion of a side surface 42d (upper portion of side surface 42d) of the pad 42P. In the via wiring 44V illustrated in FIG. 7B, the diameter D3 of the second via portion 442b on the upper surface of the pad 42P is larger than the diameter of the pad 42P.

At least two of the via wiring 44V including the first and second via portions 441, 442 (refer to FIG. 1C), the via wiring 44V including the first and second via portions 441, 442a (refer to FIG. 7A), and the via wiring 44V including the first and second via portions 441, 442b (refer to FIG. 7B) may be formed on a single wiring substrate. Additionally, the via wiring 44V of FIG. 7A, which includes the first and second via portions 441, 442a, or the via wiring 44V of FIG. 7B, which includes the first and second via portions 441, 442b, may be formed on the pad 42P including the upper surface 42c illustrated in FIG. 5B.

In the above embodiments, each of the wiring substrates 10, 10a includes the substrate body 20 (core substrate 21). Instead, the via wiring structure in the above embodiments may be applied to a coreless wiring substrate that does not include a core substrate.

FIG. 8A illustrates a further modified example of a wiring substrate 10b. The wiring substrate 10b is a coreless wiring substrate that does not include a core substrate. In the example of FIG. 8A, the wiring substrate 10b includes the via wirings 44V illustrated in FIGS. 1A and 1C.

The wiring substrate 10b includes the insulation layer 43, the wiring layers 42, 44, and the protective insulation layers 500, 600. The wiring layer 42 is located on one of the upper surface 43a and the lower surface 43b of the insulation layer 43 (lower surface 43b in FIG. 8A). The wiring layer 44 is located on the other surface (the upper surface 43a in FIG. 8A).

The wiring layer 42 is embedded in the insulation layer 43. The wiring layer 42 includes a lower surface 42b exposed from the lower surface 43b of the insulation layer 43. In other words, the insulation layer 43 covers the entire upper surface 42a and the entire side surfaces of the wiring layer 42. In the example of FIG. 8A, the lower surface 42b of the wiring layer 42 is flush with the lower surface 43b of the insulation layer 43.

The insulation layer 43 includes the through holes 43X extending through the insulation layer 43 from the upper surface 43a to the lower surface 43b. Each through hole 43X includes the first hole portion 431 and the second hole portion 432 and partially exposes the upper surface 42a of the wiring layer 42 as the pads 42P in the same manner as the structure illustrated in FIG. 1C.

The wiring layer 44 includes the via wirings 44V, which are formed in the through holes 43X of the insulation layer 43, and wiring patterns formed on the upper surface 43a of the insulation layer 43. Each via wiring 44V includes the first via portion 441 and the second via portion 442 in the same manner as the structure illustrated in FIG. 1C.

The protective insulation layer 500 is formed on the upper surface 43a of the insulation layer 43 to cover a portion of the wiring layer 44. The protective insulation layer 500 includes openings 500X that partially expose the wiring patterns of the wiring layer 44 as the external connection pads P1.

The protective insulation layer 600 is formed on the lower surface 43b of the insulation layer 43 and the lower surface 42b of the wiring layer 42. The protective insulation layer 600 includes an opening 600X partially exposing the wiring layer 42 and the insulation layer 43.

The wiring layer 42 includes the pads 42P functioning as via receiving pads in the same manner as the structure illustrated in FIG. 1C. Additionally, the wiring layer 42 includes external connection pads P3, which function as semiconductor element mount pads, and wiring patterns 42L, which respectively connect the pads 42P and the pads P3. The opening 600X of the protective insulation layer 600 exposes the external connection pads P3 together with a portion of each wiring pattern 42L.

In this manner, the via wirings 44V are applicable to the coreless wiring substrate 10b. The via wirings 44V illustrated in FIG. 8A have the structure illustrated in FIG. 1C but may have the structure illustrated in FIG. 7A or 7B. Further, the coreless wiring substrate 10b may include both of the via wiring of FIG. 7A and the via wiring of FIG. 7B. Additionally, the coreless wiring substrate 10b may include the via wiring of FIG. 5B or the wiring structure of FIG. 6. The coreless wiring substrate 10b also has the advantages (1) and (2).

FIG. 8B illustrates a semiconductor device 1a including the coreless wiring substrate 10b of FIG. 8A. FIG. 8B illustrates the wiring substrate 10b of FIG. 8A that is inverted upside down. The semiconductor device 1a includes a semiconductor element 100 mounted on the wiring substrate 10b. The semiconductor element 100 is electrically connected to the wiring layer 42 by bumps 101 formed on the external connection pads P3. The bumps 101 are, for example, solder bumps formed on the semiconductor element 100. The gap between the wiring substrate 10b and the semiconductor element 100 is filled with the underfill resin 102.

The solder bumps 12 are formed on the external connection pads P1 of the wiring substrate 10b in the same manner as the structure illustrated in FIG. 1A. The solder bumps 12 function as external connection terminals used to mount the semiconductor device 1a (wiring substrate 10b) on another board, for example, a mount board such as a motherboard. The external connection terminals may be solder balls, lead pins, stud bumps, or the like.

In FIG. 8B, the semiconductor element 100 is mounted on the wiring layer 42, and the solder bumps 12 are bonded to the wiring layer 44. Instead, when solder bumps are bonded to the wiring layer 42, semiconductor element(s) may be mounted on the wiring layer 44.

CLAUSES

This disclosure further encompasses embodiments describes below.

1. A method for manufacturing a wiring substrate, the method including:
forming an insulation layer that covers a pad;
forming an opening that partially exposes an upper surface of the pad by irradiating the insulation layer with a laser beam, wherein the forming an opening includes forming a transformed portion by heating the pad with the laser beam to transform a portion of the insulation layer that is in contact with the pad around the opening;

forming a through hole in the insulation layer by removing the transformed portion from the insulation layer, wherein the through hole includes a first hole portion and a second hole portion, the first hole portion is defined by a portion of the opening and has a diameter that is decreased from an upper surface of the insulation layer toward the pad, and the second hole portion has a diameter that is increased from a lower end of the first hole portion toward the pad; and
forming a via wiring by filling the through hole with a conductive body, wherein the via wiring includes a first via portion and a second via portion, the first via portion has a diameter that is decreased from the upper surface of the insulation layer toward the pad, and the second via portion has a diameter that is increased from a lower end of the first via portion toward the pad.

2. The method according to clause 1, wherein the diameter of the second via portion at the upper surface of the pad is larger than the diameter of the first via portion at the upper surface of the insulation layer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
a pad;
an insulation layer that covers the pad; and
a via wiring extending through the insulation layer and connected to the pad, wherein:
the via wiring includes
a first via portion that is tapered or shaped as an inverted truncated cone so that the first via portion has a diameter that is decreased from an upper surface of the insulation layer toward the pad, and
a second via portion having a diameter that is increased from a lower end of the first via portion toward the pad; and
the diameter of the second via portion at an upper surface of the pad is larger than the diameter of the first via portion at the upper surface of the insulation layer.

2. The wiring substrate according to claim 1, wherein the diameter of the second via portion at the upper surface of the pad is equal to a diameter of the pad.

3. The wiring substrate according to claim 1, wherein the diameter of the second via portion at the upper surface of the pad is smaller than a diameter of the pad.

4. The wiring substrate according to claim 1, wherein
the diameter of the second via portion at the upper surface of the pad is larger than a diameter of the pad, and
the pad includes a side surface that is partially covered by the second via portion.

5. The wiring substrate according to claim 1, further comprising a through hole extending through the insulation layer to expose the pad, wherein:
the through hole includes
a first hole portion having a diameter that is decreased from the upper surface of the insulation layer toward the pad, and a second hole portion having a diameter that is increased from a lower end of the first hole portion toward the pad; and the via wiring is a conductive body with which the through hole is filled.

6. The wiring substrate according to claim 1, wherein the second via portion includes a peripheral surface formed as a curved surface that is roundly bulged toward the upper surface of the insulation layer.

7. The wiring substrate according to claim 1, wherein the upper surface of the pad is recessed and curved so that a center portion of the upper surface of the pad is located at a lower position than a peripheral portion of the upper surface of the pad.

8. The wiring substrate according to claim 1, wherein a length of the first via portion is set to 80% to 98% of a length of the via wiring.

9. The wiring substrate according to claim 1, the wiring substrate is a coreless wiring substrate that is free from a core substrate.

10. A semiconductor device comprising:
the wiring substrate according to claim 1; and
a semiconductor element mounted on the wiring substrate.

11. The wiring substrate according to claim 1, wherein a length of the first via portion is greater than a length of the second via portion.

12. The wiring substrate according to claim 1, wherein the first via portion includes:
an upper end that is located at the upper surface of the insulation layer and has a first top diameter; and
a lower end that has a first bottom diameter smaller than the first top diameter, and
the second via portion includes:
an upper end that has a second top diameter equal to the first bottom diameter; and
a lower end that is located at an upper surface of the pad and has a second bottom diameter larger than the first top diameter.

13. The wiring substrate according to claim 1, wherein the via wiring is a plating metal.

14. The wiring substrate according to claim 1, wherein the insulation layer is an insulative resin.

15. The wiring substrate according to claim 1, further comprising:
a first wiring layer including the pad and a wiring pattern; and
a second wiring layer arranged on the insulation layer, wherein
the insulation layer covers the first wiring layer,
the via wiring extends through the insulation layer to connect the pad to the second wiring layer.

16. The wiring substrate according to claim 1, wherein
the insulation layer includes a lower surface that forms a lower surface of the wiring substrate,
the pad includes a lower surface and a side surface,
the lower surface of the pad is exposed at the lower surface of the insulation layer,
the side surface and the upper surface of the pad are covered by the insulation layer, and
the via wiring extending through the insulation layer is connected to the upper surface of the pad.

* * * * *